(12) United States Patent
Yokoyama et al.

(10) Patent No.: US 10,109,337 B2
(45) Date of Patent: Oct. 23, 2018

(54) MEMORY MACRO AND SEMICONDUCTOR INTEGRATED CIRCUIT DEVICE

(71) Applicant: Renesas Electronics Corporation, Tokyo (JP)

(72) Inventors: Yoshisato Yokoyama, Tokyo (JP); Yoshikazu Saito, Tokyo (JP); Shunya Nagata, Tokyo (JP); Toshiaki Sano, Tokyo (JP); Takeshi Hashizume, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/613,882

(22) Filed: Jun. 5, 2017

(65) Prior Publication Data

US 2017/0352399 A1    Dec. 7, 2017

(30) Foreign Application Priority Data

Jun. 6, 2016   (JP) .................................. 2016-112442

(51) Int. Cl.
| | |
|---|---|
| *G11C 7/00* | (2006.01) |
| *G11C 11/405* | (2006.01) |
| *G11C 7/06* | (2006.01) |
| *G11C 8/16* | (2006.01) |
| *G11C 11/406* | (2006.01) |
| *G11C 11/408* | (2006.01) |
| *H03K 19/177* | (2006.01) |
| *G11C 29/02* | (2006.01) |
| *G11C 29/32* | (2006.01) |
| *G11C 29/12* | (2006.01) |

(52) U.S. Cl.
CPC ............ *G11C 11/405* (2013.01); *G11C 7/062* (2013.01); *G11C 8/16* (2013.01); *G11C 11/4085* (2013.01); *G11C 11/4087* (2013.01); *G11C 11/40603* (2013.01); *G11C 29/024* (2013.01); *G11C 29/32* (2013.01); *H03K 19/1776* (2013.01); *G11C 2029/1202* (2013.01); *G11C 2207/104* (2013.01)

(58) Field of Classification Search
CPC .................................................. G11C 11/4087
USPC ........................................ 356/189.07, 230.08
See application file for complete search history.

(56) References Cited

U.S. PATENT DOCUMENTS

| | | | |
|---|---|---|---|
| 2005/0057996 A1* | 3/2005 | Yamauchi .............. | G11C 7/103 365/222 |
| 2007/0255981 A1 | 11/2007 | Eto | |
| 2010/0329069 A1* | 12/2010 | Ito ........................... | G11C 8/08 365/230.06 |

FOREIGN PATENT DOCUMENTS

JP        2007-257791 A     10/2007

* cited by examiner

*Primary Examiner* — Hoai V Ho
(74) *Attorney, Agent, or Firm* — Sughrue Mion, PLLC

(57) ABSTRACT

Provided is a memory macro which allows detection of a fault in a fetch circuit for an address signal which is input. The memory micro includes an address input terminal, a clock input terminal, a memory array and a control unit. The control unit includes a temporary memory circuit which fetches an input address signal which is input into the address input terminal in synchronization with an input clock signal which is input from the clock input terminal and outputs the input address signal as an internal address signal. The memory macro further includes an internal address output terminal which outputs the internal address signal for comparison with the input address signal.

18 Claims, 13 Drawing Sheets

| MODE | SDS | SDO | Iin[] |
|---|---|---|---|
| NORMAL MODE | 0 | 1 | al[] |
| Scan Data Shift | 1 | 0 | dl[] |
| Scan Data CAPTURE | 1 | 1 | al[]^dl[] |

MEMORY MACRO AND SEMICONDUCTOR INTEGRATED CIRCUIT DEVICE

CROSS-REFERENCE TO RELATED APPLICATIONS

The disclosure of Japanese Patent Application No. 2016-112442 filed on Jun. 6, 2016 including the specification, drawings and abstract is incorporated herein by reference in its entirety.

BACKGROUND

The present invention relates to a memory macro and a semiconductor integrated circuit device (LSI: Large Scale Integrated circuit) using the memory macro, and in particular relates to the memory macro and the semiconductor integrated circuit device which are favorably utilized for fault detection of an address selection circuit.

In international standards (for example, ISO26262) for functional safety regarding electric and electronic components of automobiles, fault detection in operation for address selection has come to be requested to a memory such as an SRAM (Static RandomAccess Memory) and so forth in addition to fault detection on the data side. Although so far real time fault detection has been possible by using an error detection (ECC: Error Correction Code) circuit, when a fault has occurred in address selection, it is difficult to detect the fault.

In Japanese Unexamined Patent Application Publication No. 2007-257791, a semiconductor memory device with redundant function which is provided by an ECC memory by changing the configuration of the ECC memory is disclosed. In which address in the memory a defective bit is present is detected in advance, this data is stored as defective address information, and when actually accessing the memory, the relief measures are taken by comparing an address signal which is input with the stored defective address information and replacing the defective bit of the defective address concerned with a redundant bit.

SUMMARY

As a result of investigations that the inventors and others of the present invention have made on the semiconductor memory device disclosed in Japanese Unexamined Patent Application Publication No. 2007-257791, it was found that there exist such new matters to be solved as follows.

A fault in a data-side circuit is detected in a memory with the ECC circuit being added such as the memory disclosed in Japanese Unexamined Patent Application Publication No. 2007-257791 and so forth. In addition, in cases of non-selection, multiple selection and so forth, even when a fault has occurred in an address selection circuit, the fault is observed as an error on the data side and therefore the fault is detected to some extent.

However, when the fault has occurred in a circuit which fetches an address signal which is input, even in a case where address selection has been erroneously performed, it is difficult to detect the erroneous address selection as a data error and therefore it is difficult to detect the erroneous address selection as the fault.

Although in the following, measures for solving such disadvantages as mentioned above will be described, other matters to be solved and novel features of the present invention will become apparent from the description of the present specification and the appended drawings.

According to one embodiment of the present invention, there is provided a memory micro which includes an address input terminal, a clock input terminal, a memory array and a control unit and is configured as follows. The control unit includes a temporary memory circuit which fetches an input address signal which is input into the address input terminal in synchronization with an input clock signal which is input from the clock input terminal and outputs the input address signal so fetched as an internal address signal. The memory macro further includes an internal address output terminal which outputs the internal address signal for comparison with the input address signal.

According to another embodiment of the present invention, there is provided a semiconductor integrated circuit device which includes the above-mentioned memory macro.

An advantageous effect which is obtained by the memory macro and the semiconductor integrated circuit device according to the above mentioned embodiments will be briefly described as follows.

That is, it is possible to detect the fault in the circuit which fetches the address signal which is input.

DETAILED DESCRIPTION

Preferred embodiments of the present invention will be described in detail. Incidentally, in all of the drawings used to describe the modes for carrying out the invention, the same numerals are assigned to the elements having the same functions and repetitive description thereof is omitted.

First Embodiment

Figure 1:
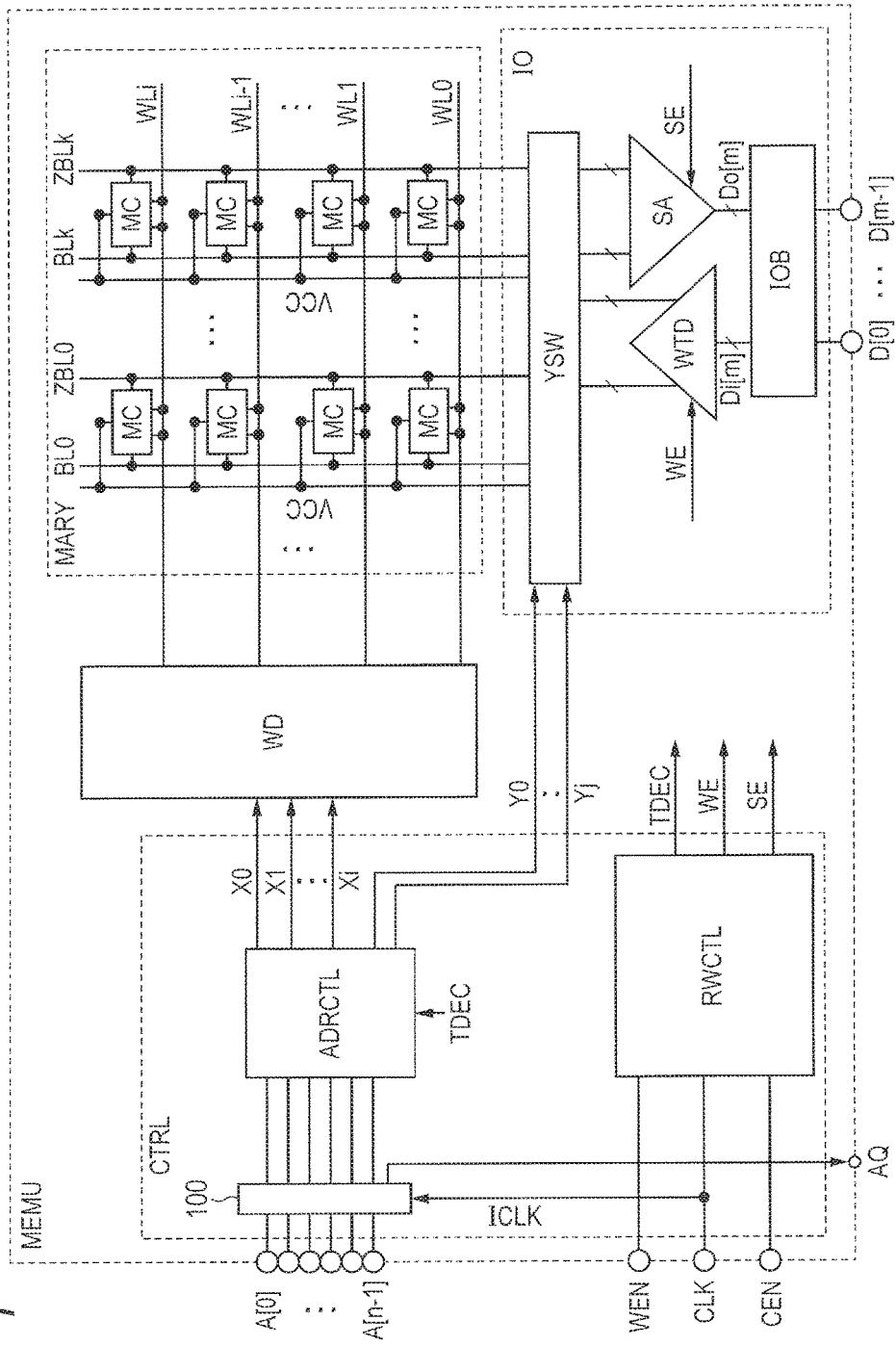
FIG. 1 is a block diagram illustrating one configurational example of a memory macro according to each embodiment of the present invention.

FIG. 1 is a block diagram illustrating one schematic configurational example of a memory macro MEMU which is included in a semiconductor integrated circuit device 1000 according to the first embodiment and the following respective embodiments. FIG. 1 illustrates the example that the memory macro MEMU is an SRAM macro. The memory macro MEMU is a memory unit that the memory macro which is provided as a library in a design environment of the semiconductor integrated circuit device, that is, an LSI has been instantiated as design data of an LSI chip and is sometimes called a memory module. The memory macro which is provided as the library may be memories of all forms such as electrically rewritable nonvolatile memories and so forth such as the SRAM, a DRAM (Dynamic Random Access Memory), a ROM (Read Only Memory), a flash memory and so forth. The memory macros of various specifications may be provided as the libraries or may be synthesized by using a compiler such as a RAM compiler and so forth. The compiler is capable of synthesizing the memory macros into a memory macro having a desirable size and a desirable performance by designating a bit number, a word number and other specifications. In general, function information, timing information and so forth which have been described in a higher level language are contained in the memory macro in addition to layout information and circuit information. Although in the present specification, the word "memory macro" is used, use of the word "memory macro" does not mean to make a strict distinction between a case where the word "memory macro" and a case where the words "memory unit", "memory module" and so forth are used. That is, the word "memory macro" used in the present specification may be replaced with other words such as "memory unit", "memory module", "SRAN macro" and "ROM macro", or simply with words such as "memory", "SRAM", "ROM" and so forth in reading.

The memory macro MEMU illustrated in FIG. 1 includes a control unit CTRL, a word line drive circuit WD, a memory array MARY, a data input-output unit IO and so forth. The control unit CTRL includes a temporary memory circuit 100, an address control circuit (an address decoder) ADRCTL, a read/write control circuit RWCTL and so forth. The data input-output unit IO includes a column selection circuit YSW, a write drive circuit WTD, a sense amplifier circuit SA, an input-output buffer circuit IOB and so forth. The memory array MARY includes i+one word lines WL0 to WLi which extend in a row direction, k+one bit line pairs BL0/ZBL0 to BLk/ZBLk which extend in a column direction which is orthogonal to the row direction, a plurality of memory cells MC each of which is arranged in the vicinity of each intersection point between each of the i+one word lines WL0 to WLi and each of the k+one bit line pairs BL0/ZBL0 to BLk/ZBLk and so forth. Each of the plurality of memory cells MC is coupled to one corresponding word line and one corresponding bit line pair. Each bit line pair is configured by two complementary bit lines (for example, the lines BL0 and ZBL0) adapted to transfer a complementary signal.

In the control unit CTRL, the temporary memory circuit 100 fetches input address signals A[0] to A[n−1] which are input from an address input terminal in synchronization with a clock signal CLK which is input from a clock input terminal and temporarily stores the input address signals so fetched. ICLK which is illustrated in the drawing denotes an internal clock signal and exemplifies the name of a signal in the memory macro MEMU when the input clock signal CLK is distributed and supplied to an internal circuit of the memory micro MEMU via a clock buffer illustration of which is omitted. Although the same also applies to the respective embodiments, it is supposed that a propagation delay from the clock signal CLK to the internal clock signal ICLK is sufficiently small and "fetches in synchronization with the clock signal CLK which is input" and "fetches in synchronization with the internal clock signal ICLK" are not strictly distinguished from each other.

The read/write control circuit RWCTL generates a decode start-up signal TDEC, an internal write enable signal WE and a sense amplifier enable signal SE in accordance with various control signals (WEN, CLK, CEN) sent from control terminals of the memory macro MEMU. WEN denotes a write enable signal used to distinguish a read command from a write command, CLK denotes the clock signal which serves as a standard for reading and writing operations, and CEN denotes a chip enable signal used to control selection/non-selection of the memory macro MEMU.

Here, although the final "N" of each signal name means that the signal concerned is a negative logic signal, that is, a control signal which is asserted at a low level and is negated at a high level, the aforementioned matter is simply one example and whether the positive logic or the negative logic is adopted for the control signal is optional. In addition, "A[0] to A[n−1]" indicate input address signals of n bits and are also denoted as "A[n]", "A[n−1:0]" and so forth collectively. There are cases where also the address input terminal is referred to by using the same symbol. In addition, there are also cases where the output signal name and the output terminal name are referred to by using the same symbol. The same is true of other signal lines in the present specification.

The temporary memory circuit 100 supplies the internal address signals into which the input address signals A[0] to A[n−1] have been fetched to the address control circuit ADRCTL and outputs the same internal address signals or a signal which is generated on the basis of the internal address signals from an internal address output terminal AQ. Here, there are various configurational examples of the input address signal A[n], the internal address signal which is supplied to the address control circuit ADRCTL and the signal which is output from the internal address output terminal AQ. The configurational examples of the above-mentioned signals will be described in detail in the following description of the respective embodiments.

The address control circuit ADRCTL decodes (or pre-decodes) the internal address signal by using the decode start-up signal TDEC as a trigger and outputs the row selection signals X0 to Xi and the column selection signal Y0 to Yi which are the address decode signals. The word line drive circuit WD selects (activates) any one of the i+one word lines in accordance with the row selection signals X0 to Xi. The column selection circuit YSW selects m bit line pairs from the k+one bit line pairs in accordance with the column selection signals Y0 to Yi.

The input-output buffer circuit IOB fetches a data input signal Di[m] from a data terminal D[m] of the memory macro MEMU and transfers the data input signal Di[m] so fetched to the write drive circuit WTD, and fetches an output signal from the sense amplifier circuit SA and outputs the output signal so fetched to the data terminal D[m] as a data output signal Do[m]. The write drive circuit WTD differentially amplifies data from the input-output buffer circuit IOB in accordance with the write enable signal WE and transfers the data so amplified to a predetermined bit line pair via the aforementioned column selection circuit YSW. The sense amplifier circuit SA differentially amplifies a signal pair which has been transferred from the predetermined bit line pair via the column selection circuit YSW by using the sense amplifier enable signal SE as a trigger and outputs the signal pair so amplified toward the input-output buffer circuit IOB.

Figure 2:
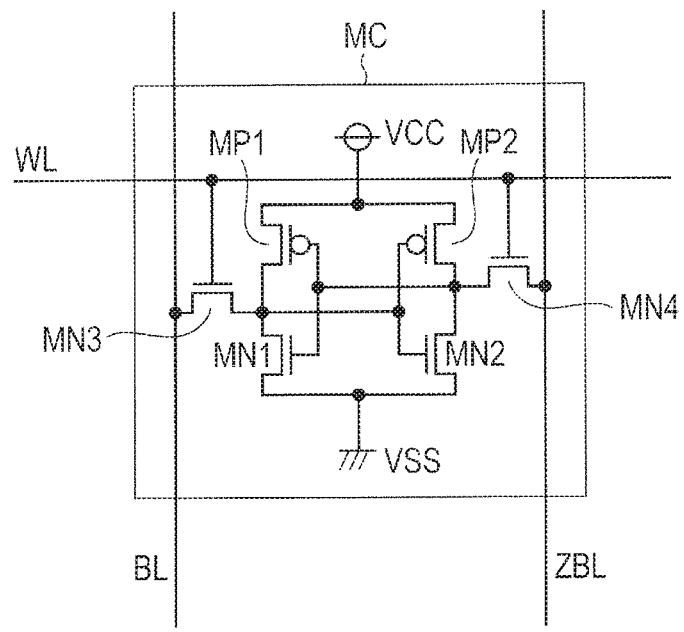
FIG. 2 is a circuit diagram illustrating one configurational example of a memory cell.

FIG. 2 is a circuit diagram illustrating one configurational example of each memory cell MC in the memory array MARY in the memory macro MEMU in FIG. 1. Here, the memory cell MC illustrated in FIG. 2 is an SRAM memory cell which includes four N channel MOS (Metal Oxide Semiconductor) transistors MN1 to MN4 and two P channel MOS transistors MP1 and MP2. In the transistor MN3, a gate is coupled to the word line WL and one of a source and a drain is coupled to the positive electrode side bit line BL. In the transistor MN4, a gate is coupled to the word line WL and one of a source and a drain is coupled to the negative electrode side bit line ZBL. The transistors MN1 and MP1 and the transistors MN2 and MP2 respectively configure CMOS (Complementary Metal Oxide Semiconductor) inverter circuits between a supply voltage source VCC and a ground supply voltage source VSS. These two CMOS inverter circuits configure one latch circuit by coupling an input terminal of one inverter circuit to an output terminal of the other inverter circuit. The other of the source and the drain of the transistor MN4 is coupled to the input terminal (the output terminal of the CMOS inverter circuit (MN2 and MP2)) of the CMOS inverter circuit (MN1 and MP1) and the other of the source and the drain of the transistor MN3 is coupled to the input terminal (the output terminal of the CMOS inverter circuit (MN1 and MP1)) of the CMOS inverter circuit (MN2 and MP2).

Figure 3:
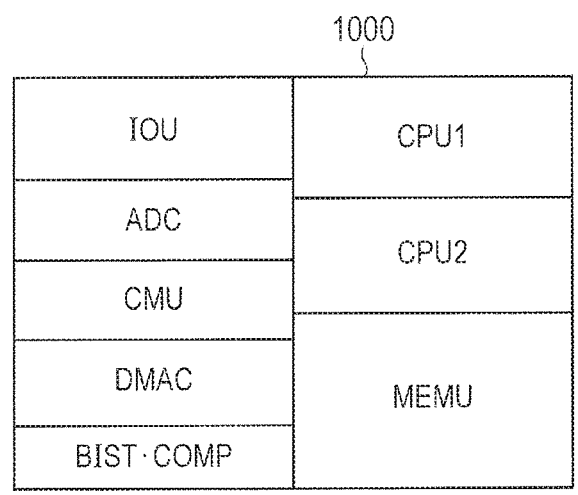
FIG. 3 is a block diagram schematically illustrating one configurational example of a semiconductor integrated circuit device with the memory macro being loaded.

FIG. 3 is a block diagram schematically illustrating one configurational example of the semiconductor integrated circuit device 1000 with the memory macro MEMU being loaded. The semiconductor integrated circuit device 1000 is an LSI that various logic circuits and memory circuits are formed in one semiconductor chip and is called a microcontroller unit (MCU), a microprocessor unit (MPU), an SOC (System On a Chip) and so forth. The semiconductor integrated circuit device 1000 illustrated in FIG. 3 is, for example, an in-vehicle LSI. The semiconductor integrated circuit device 1000 includes two processor units CPU1 and CPU2 which perform a lockstep operation, the memory unit (memory macro) MEMU, a direct memory access controller unit DMAC, an analog/digital conversion unit ADC, a communication unit CMU, an input-output interface unit IOU, a test circuit (BIST), a comparator circuit (COMP) and so forth. Configurational examples illustrated in FIG. 1 and described in the respective embodiments are applied as the configuration of the memory unit MEMU.

The processor units CPU1 and CPU2 perform predetermined arithmetic operation processing which is based on a program. The direct memory access controller unit DMAC performs data transfer between, for example, the communication unit CMU and the memory unit MEMU. The analog/digital conversion unit ADC converts, for example, sense data (in the form of analog signals) which is output from a temperature sensor, a pressure sensor and so forth which are attached to an in-vehicle engine into digital data. The digital data so converted is stored into, for example, the memory unit MEMU and is then transferred to the processor units CPU1 and CPU2 and is processed by the processor units CPU1 and CPU2. The communication unit CMU is coupled to an in-vehicle network such as CAN (Controller Area Network) and so forth and performs inputting and outputting of communication data. The input-output interface unit IOU acts as an input-output interface between the semiconductor integrated circuit device 1000 and the outside. The memory unit MEMU is appropriately accessed by receiving the address signals from the processor units CPU1 and CPU2 and data is stored into the memory cell in the memory unit MEMU and/or the data is read out of the memory cell MC in the memory unit MEMU. In the semiconductor integrated circuit such as the SOC and so forth, the memory unit MEMU is generated by, for example, an automatic design tool which is called a memory compiler and so forth by using design data which is called memory IP (Intellectual Property) and so forth and is implemented in the LSI.

As described above, the semiconductor integrated circuit device 1000 according to the first embodiment includes the memory (memory macro) MEMU into which the input address signal A[n] and the input clock signal CLK are input and which stores data D[m] and outputs the stored data D[m] and the comparator COMP and is configured as follows. The memory MEMU includes the memory array MARY which includes the plurality of memory cells MC which are selected by the word lines WL0 to WLi, the word line drive circuit WD, the data input-output unit IO which outputs the data in the memory array, the control unit CTRL and so forth.

The control unit CTRL includes the temporary memory circuit 100 which fetches the input address signal A[n] in synchronization with the input clock signal CLK (ICLK) and outputs the input address signal so fetched as the internal address signal, and the address control circuit (the address decoder) ADRCTL which outputs the address decode signals (the row selection signals X0 to Xi and the column selection signals Y0 to Yi) on the basis of the internal address signal. The word line drive circuit WD selects and drives the word line (one of the word lines WL0 to WLi) which corresponds to the memory cell MC concerned of the memory array MARY on the basis of the address decode signals. Thereby, the data input-output unit IO is allowed to output the data in the memory cell concerned of the memory array MARY which has been selected by the word line concerned to the data input-output terminal D[m]. The comparator COMP compares the input address signal A[n] with the internal address signal to see whether the input address signal A[n] matches the internal address signal.

Thereby, it is possible to detect a fault in address selection as a fault in the circuit which fetches the address signal which is input. That is, when the input address signal A[n] does not match the internal address signal, it is possible to detect mismatching of the signals as the fault in the temporary memory circuit 100.

Figure 4:
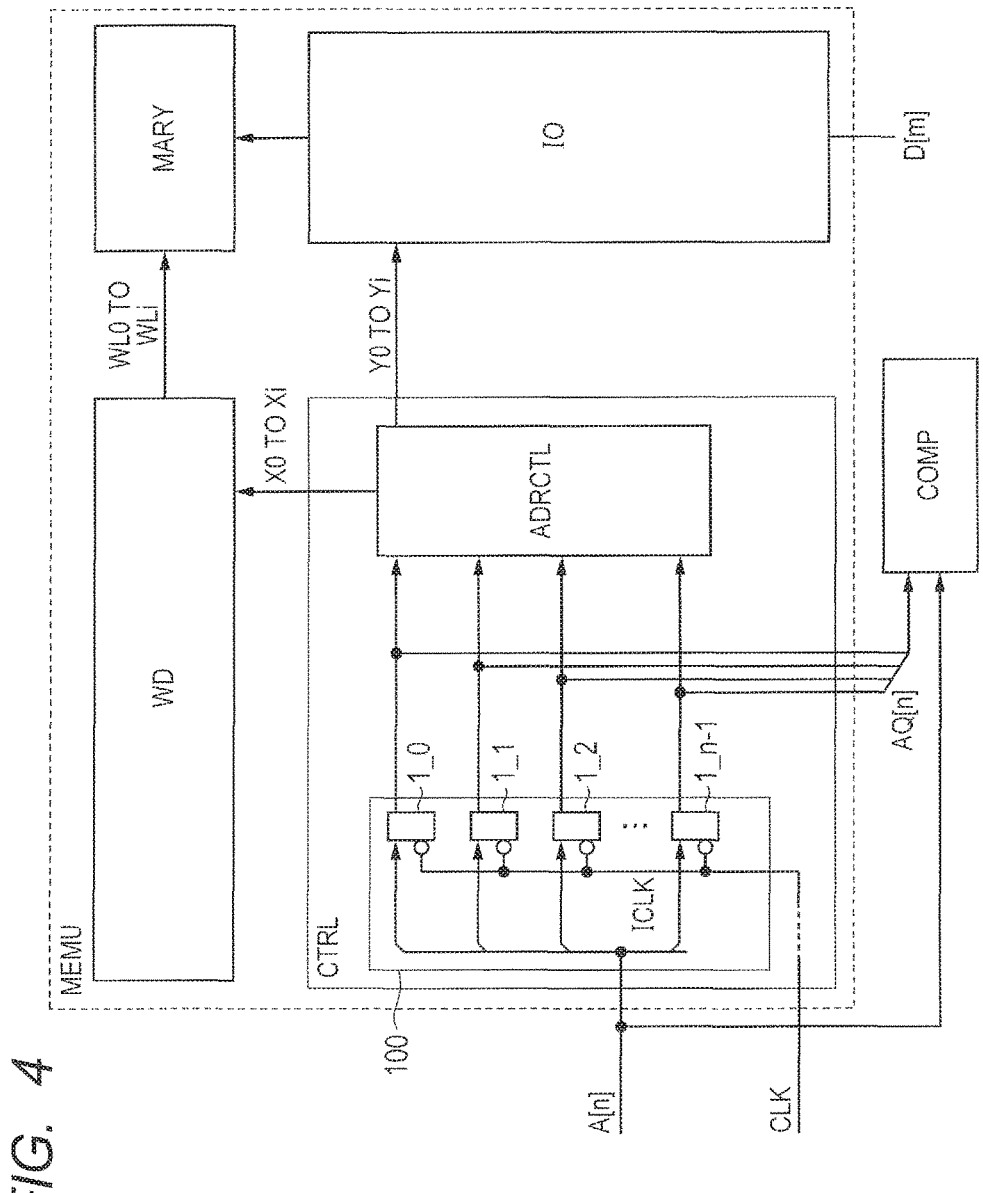
FIG. 4 is a block diagram illustrating one configurational example of a memory macro according to a first embodiment of the present invention.

FIG. 4 is a block diagram illustrating one configurational example of the memory macro MEMU according to the first embodiment.

The memory macro MEMU includes the address input terminal A[n], the clock input terminal CLK, the data input-output terminal D[m], the memory array MARY which includes the plurality of memory cells MC which are selected by the word lines WL0 to WLi, the word line drive circuit WD, the data input-output unit IO which outputs the data in the memory array MARY to the data input-output terminal D[m], the control unit CTRL and so forth.

The control unit CTRL includes the temporary memory circuit 100 which is configured by latch circuits 1_0 to 1_n−1 and the address decoder ADRCTL and so forth. The latch circuits 1_0 to 1_n−1 fetch respectively the input address signals A[0] to A[n−1] in synchronization with the clock signal CLK (ICLK) and output the fetched input address signals as internal address signals AQ[0[ to AQ[n−1]. The address decoder ADRCTL outputs the address decode signals (X0 to Xi and Y0 to Yi) on the basis of the internal address signal AQ[n] (AQ[0] to AQ[n−1]).

The word line drive circuit WD selects and drives the word line corresponding to the memory cell MC concerned of the memory array MARY on the basis of the row selection signals X0 to Xi in the address signals and the data input-output unit IO outputs the data in the memory cell MC concerned of the memory array MARY which has been selected by the word line concerned to the data input-output terminal D[m].

The memory macro MEMU according to the first embodiment further includes an internal address output terminal AQ[n] which outputs the internal address signal AQ[n] (AQ[0] to AQ[n−1]) for comparison with the input address signal A[n].

The comparator COMP which compares the input address signal A[n] with the internal address signal AQ[n] is implemented or formed outside the memory macro MEMU as a logic circuit. The comparator COMP may be implemented or formed as an internal circuit of the memory macro MEMU.

Figure 5:
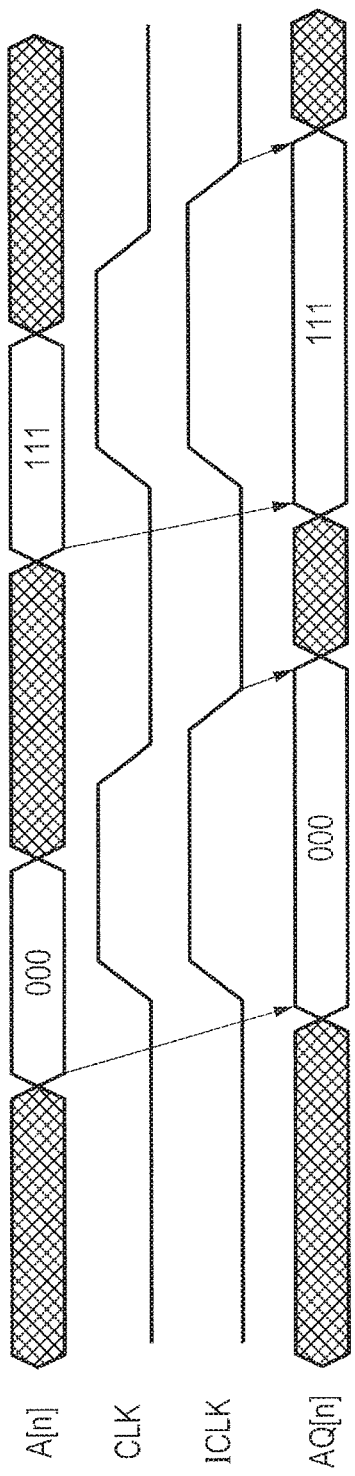
FIG. 5 is a timing chart illustrating one operational example of the memory macro according to the first embodiment.

FIG. 5 is a timing chart illustrating one operational example of the memory macro MEMU. The latch circuits 1_0 to 1_n−1 each fetches the input address signal A[n] when the clock signal CLK (ICLK) is at a low level and, when the clock signal CLK (ICLK) is at a high level, retains the value which has been fetched when the clock signal CLK (ICLk) is at the low level without fetching the input address signal A[n] which has been changed after the above-mentioned value has been fetched and outputs the value so retained as the internal address signal AQ[n].

Thereby, when the circuit which fetches the address signal which is input is one of the latch circuits 1_0 to 1_n−1, it is possible to detect the fault occurred in address selection as the fault of the latch circuit concerned.

Second Embodiment

Figure 6:
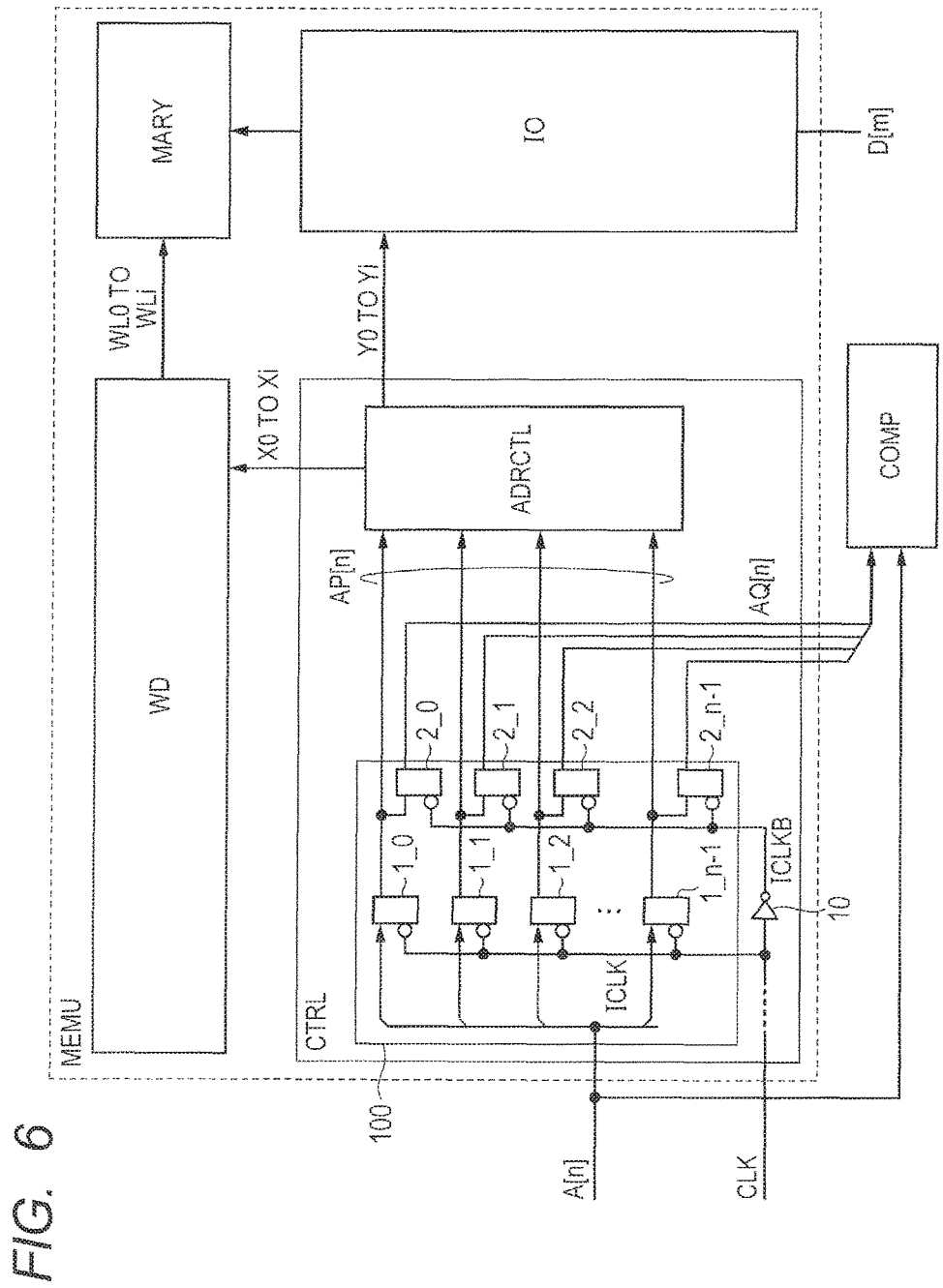
FIG. 6 a block diagram illustrating one configurational example of a memory macro according to a second embodiment of the present invention.

FIG. 6 is a block diagram illustrating one configurational example of the memory macro MEMU according to the second embodiment.

The memory macro MEMU includes the memory array MARY which includes the plurality of memory cells MC which are selected by the word lines WL0 to WLi, the word line drive circuit WD, the data input-output unit IO which outputs the data in the memory array MARY to the data input-output terminal D[m], the control unit CTRL and so forth similarly to the memory macro MEMU according to the first embodiment illustrated in FIG. 4. In addition, the memory macro MEMU further includes the address input terminal A[n], the clock input terminal CLK, the data input-output terminal D[m] and the internal address output terminal AQ[n] similarly to the memory macro MEMU according to the first embodiment illustrated in FIG. 4.

Although the control unit CTRL includes the temporary memory circuit 100 and the address decoder ADRCTL similarly to the control unit of the memory macro MEMU according to the first embodiment illustrated in FIG. 4, the temporary memory circuit 100 further includes latch circuits 2_0 to 2_n−1 in addition to the latch circuits 1_0 to 1_n−1. The clock signal ICLKB of a phase opposite to the phase of the clock signal ICLK is input into the latch circuits 2_0 to 2_n−1 and the latch circuits 2_0 to 2_n−1 operate as a flip-flop in combination with the latch circuits 1_0 to 1_n−1. An output signal AP[n] from each of the front-stage latch circuits 1_0 to 1_n−1 is supplied to the address decoder ADRCTL as an internal address signal and an output signal AQ[n] from each of the added latch circuits 2_0 to 2_n−1 is output to the internal address output terminal AQ[n]. The address decoder ADRCTL outputs the address decode signals (X0 to Xi and Y0 to Yi) on the basis of the internal address signal AP[n]. Although the signal name of the internal address signal which is input into the address decoder ADRCTL has been conveniently changed from the signal name illustrated in FIG. 4 in order to unify the name of the signal at the internal address output terminal AQ[n], the internal address signal AP[n] which is input into the address decoder ADRCTL is the same as the internal address signal AQ[n] in FIG. 4 in reality.

Since the operations of the word line drive circuit WD, the memory array MARY and the data input-output unit IO are the same as those in the first embodiment, description thereof is omitted.

Although the memory macro MEMU according to the second embodiment outputs the internal address signal AQ[n] similarly to the memory macro MEMU (in FIG. 4) according to the first embodiment for comparison with the input address signal A[n], the memory macro MEMU according to the second embodiment is different from the memory macro MEMU according to the first embodiment in the point that while the internal address signal AQ[n] is the output signal from each of the latch circuits 1_0 to 1_n−1 in the first embodiment, the internal address signal AQ[n] is the output signal from each of the latch circuits 2_0 to 2_n−1 so added at the rear stage, that is, the output signal from the flip-flop. Incidentally, the comparator COMP which compares the input address signal A[n] with the internal address signal AQ[n] is implemented or formed outside the memory macro MEMU as the logic circuit. The comparator COMP may be implemented or formed as the internal circuit of the memory macro MEMU.

Figure 7:
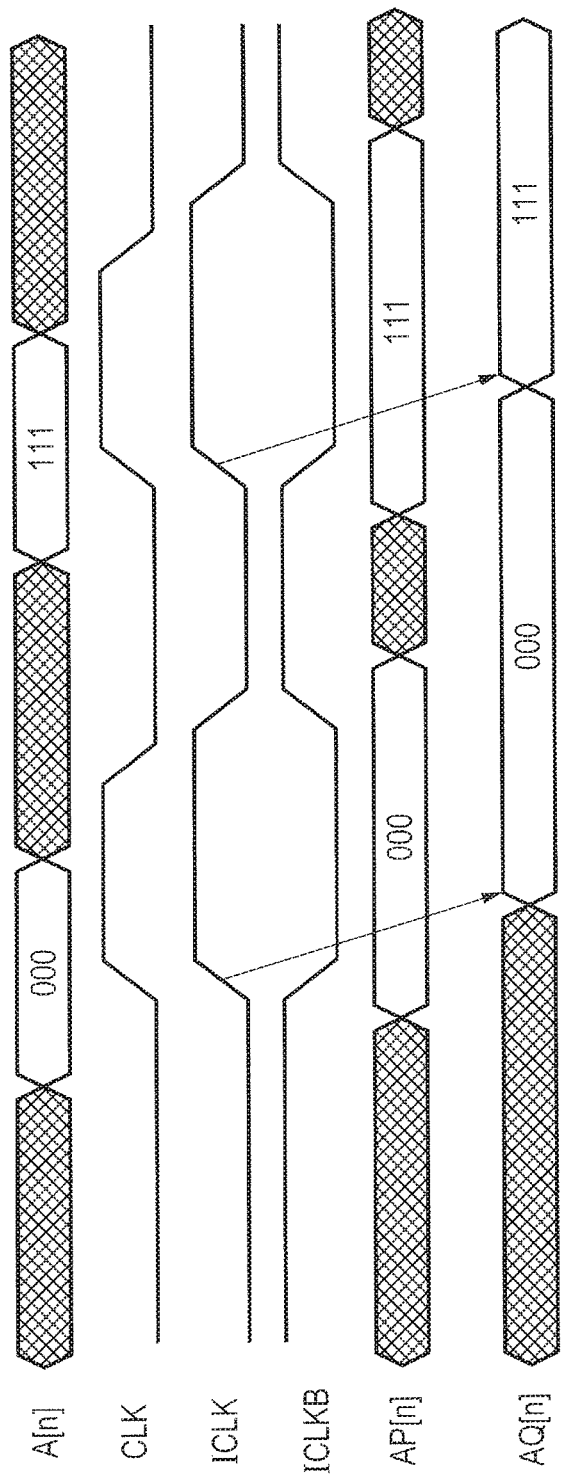
FIG. 7 is a timing chart illustrating one operational example of the memory macro according to the second embodiment.

FIG. 7 is a timing chart illustrating one operational example of the memory macro MEMU according to the second embodiment. Each of the latch circuits 1_0 to 1_n−1 fetches the input address signal A[n] when the clock signal CLK (ICLK) is at the low level and, when the clock signal CLK (ICLK) is at the high level, retains the value which has been fetched when the clock signal CLK (ICLK) is at the low level without fetching the input address signal A[n] which has been changed after the above-mentioned value has been fetched and outputs the value so retained as the internal address signal AP[n]. The internal address signal AP[n] is the same as the internal address signal AQ[n] in FIG. 5. Each of the rear-stage latch circuits 2_0 to 2_n−1 fetches the input address signal AP[n] when the clock signal ICLKB of a phase opposite to the phase of the clock signal ICLK is at the low level and, when the clock signal ICLKB is at the high level, retains the value which has been fetched when the clock signal ICLKB is at the low level without fetching the input address signal AP[n] which has been changed after the above-mentioned value has been fetched and outputs the value so retained as the internal address signal AQ[n].

Since the latch circuits function as the flip-flop, even when the input address signal has taken an indefinite value in the course of shifting of the address from "000" to "111", the influence thereof is not propagated to the internal address signal AQ[n]. When the comparator COMP is configured by a synchronization circuit which operates in synchronization with the clock signal CLK, it is possible to make the signal which has been fetched into the comparator COMP in phase with the internal address signal AQ[n] with the aid of the input address signal A[n] and therefore a timing margin in a comparing operation is alleviated.

Third Embodiment

Figure 8:
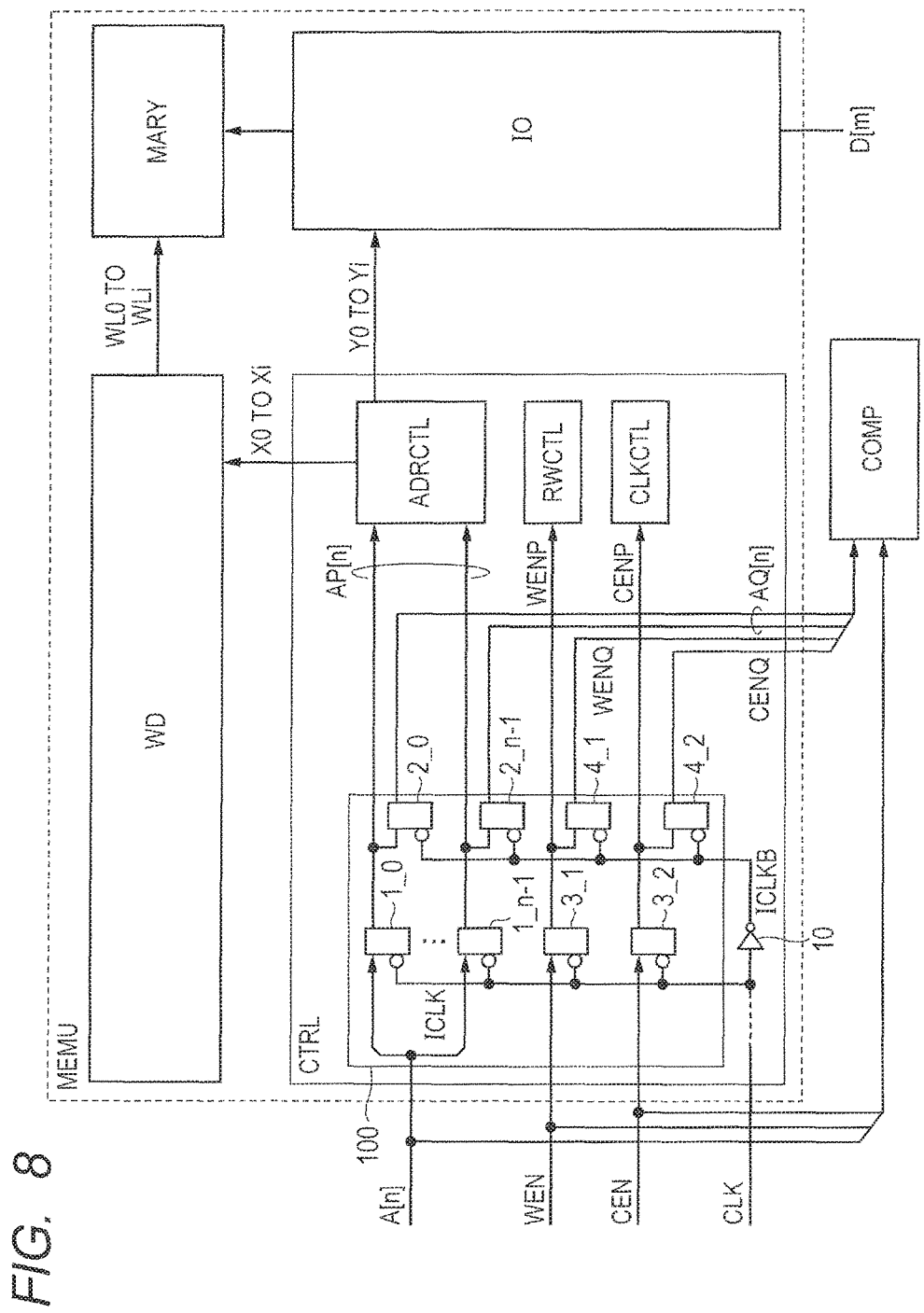
FIG. 8 is a block diagram illustrating one configurational example of a memory macro according to a third embodiment of the present invention.

FIG. 8 is a block diagram illustrating one configurational example of the memory macro MEMU according to the third embodiment.

The memory macro MEMU includes the memory array MARY which includes the plurality of memory cells MC which are selected by the word lines WL0 to WLi, the word line drive circuit WD, the data input-output unit IO which outputs the data in the memory array MARY to the data input-output terminal D[m], the control unit CTRL and so forth similarly to the memory macros MEMU according to the first and second embodiments illustrated in FIG. 4 and FIG. 6. In addition, the memory macro MEMU includes the address input terminal A[n], the clock input terminal CLK, the data input-output terminal D[m] and the internal address output terminal AQ[n] similarly to the memory macro MEMU according to the second embodiment illustrated in FIG. 5 and further includes internal access control signal output terminals WENQ and CENQ used to output internal signals of the access control signals such as the write enable signal WEN, the chip enable signal CEN and so forth.

The control unit CTRL includes the address decoder ADRCTL and the temporary memory circuit 100 which is configured by the latch circuits 1_0 to 1_n−1 and the latch circuits 2_0 to 2_n−1 and operates as a flip-flop similarly to the control unit CTRL of the memory macro MEMU according to the first embodiment illustrated in FIG. 4. The control unit CTRL further includes the read/write control circuit RWCTL, a clock control circuit CLKCTL, latch circuits 3_1 to 3_2 and latch circuits 4_1 to 4_2 differently from the control unit CTRL of the memory macro MDEMU according to the first embodiment illustrated in FIG. 4. The ICLK signal is input into the latch circuits 3_1 to 3_2, the clock signal ICLKB of the phase opposite to the phase of the ICLK signal is input into the latch circuits 4_1 to 4_2 and the latch circuits 3_1 to 3_2 and the latch circuits 4_1 to 4_2 are combined together and operate as the flip-flop.

Incidentally, although the control unit CTRL in each of the first and second embodiments illustrated in FIG. 4 and FIG. 6 also includes the read/write control circuit RWCTL, the clock control circuit CLKCTL and the latch circuits 3_1 to 3_2, illustration thereof is omitted because the above-mentioned elements have almost no relation with outputting to the comparator COMP.

The output signal AP[n] is supplied from each of the front-stage latch circuits 1_0 to 1_n−1 into which the input address signal A[n] is input to the address decoder ADRCTL and the output signal AQ[n] is output from each of the rear-stage latch circuits 2_0 to 2_n−1 to the internal address output terminal AQ[n]. Likewise, output signals are supplied from the front-stage latch circuits 3_1 to 3_2 into which the write enable signal WEN and the chip enable signal CEN are respectively input to the read/write control circuit RWCTL and the clock control circuit CLKCTL respectively and the internal access control signals WENQ and CENQ are output from the rear-stage latch circuits 4_1 to 4_2 respectively via internal access control signal output terminals.

Since the operations of the word line drive circuit WD, the memory array MARY and the data input-output unit IO are the same as those in the first and second embodiments, description thereof is omitted.

The comparator COMP which is installed outside the memory macro MEMU according to the third embodiment compares the access control signals WEN and CEN respectively with the corresponding internal access control signals WENQ and the CENQ in addition to comparison between the input address signal A[n] and the internal address signal AQ[n]. Then, when at least one comparison has ended in mismatching, the comparator COMP outputs "mismatching" as a comparison result.

Thereby, it is also possible to detect the fault in the circuit which fetches the access control signal which is input. That is, also when the access control signal does not match the internal access control signal in addition to mismatching between the input address signal and the internal address signal, it is possible to detect the mismatching as the fault in the temporary memory circuit.

Incidentally, although the configurational example of the temporary memory circuit 100 which operates as the flip-flop using two stages of the latch circuits has been illustrated in FIG. 8 similarly to that in the second embodiment illustrated in FIG. 6, the temporary memory circuit 100 may be configured by one stage of the latch circuits similarly to that in the first embodiment illustrated in FIG. 4. In addition, the comparator COMP may be implemented or formed outside the memory macro MEMU as the logic circuit and/or may be implemented or formed as the internal circuit of the memory macro MEMU.

Fourth Embodiment

When the chip enable signal CEN is included in the access control signals, the memory macro MEMU according to the fourth embodiment outputs the internal address signal AQ[n] to the internal address output terminal when the chip enable signal CEN has been asserted. On the other hand, when the chip enable signal CEN has been negated, the memory macro MEMU stops outputting of the internal address signal AQ[n].

Thereby, a frequency of driving the wiring load that the internal address signal AQ[n] is output is minimized and the power consumption is reduced. When the comparator COMP is implemented outside the memory macro MEMU as the logic circuit, there is a tendency that a layout region of a hard macro such as the memory macro MEMU is comparatively remote from a region that a random logic circuit is laid out. In this case, the wiring length from the internal address output terminal of the memory macro MEMU to the comparator COMP is increased, the load capacity is increased and the power consumption due to charge and discharge thereof is increased. For this reason, when the chip enable signal CEN is negated and the memory macro MEMU concerned is not accessed, outputting of the internal address signal AQ[n] is stopped so as to suppress the power consumption due to charge and discharge of the wiring load. Incidentally, the signal outputting of which is stopped is not limited to the internal address signal AQ[n] and it is more preferable to stop also outputting of other internal access control signals in addition to stopping of outputting of the internal address signal AQ[n].

Figure 9:
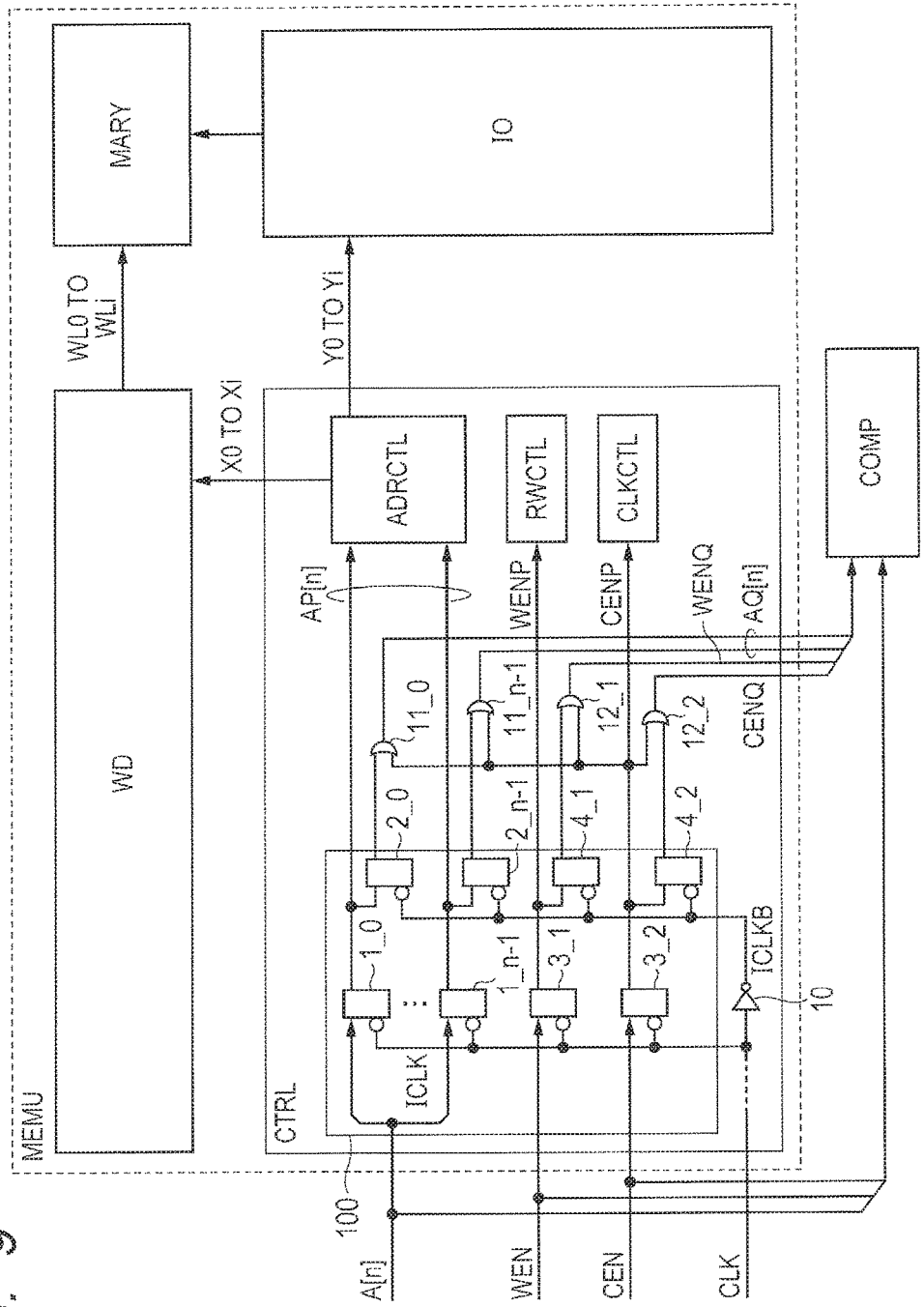
FIG. 9 is a block diagram illustrating one configurational example of a memory macro according to a fourth embodiment of the present invention.

FIG. 9 is a block diagram illustrating one configurational example of the memory macro MEMU according to the fourth embodiment. Although the memory macro MEMU according to the fourth embodiment is the same as the memory macro MEMU according to the third embodiment illustrated in FIG. 8, the memory macro MEMU according to the fourth embodiment further includes OR gates 11_0 to 11_n−1 and 12_1 to 12_2 which are installed along a path extending from the temporary memory circuit 100 to the internal address output terminal AQ[n] and the internal access control signal output terminals WENQ and CENQ. One input terminals of the OR gates 11_0 to 11_n−1 and 12_1 to 12_2 are coupled to the line of an internal signal CENP of the chip enable signal CEN. When the chip enable signal CEN is asserted and is at the low level, the internal address signal AQ[n] and the internal access control signals WENQ and CENQ are output as they are. On the other hand, when the chip enable signal CEN is negated and is at the high level, the internal address signal AQ[n] and the internal access control signals WENQ and CENQ are fixed to the high levels. Thereby, shifting of the output signals is stopped and the power consumption due to charge and discharge is suppressed.

Incidentally, although the configurational example that the chip enable signal is a negative logic signal is illustrated in FIG. 9 by way of example, when the chip enable signal is a positive logic signal, the OR gates may be replaced with AND gates and whether the positive logic or the negative logic is adopted is optional.

Fifth Embodiment

Figure 10:
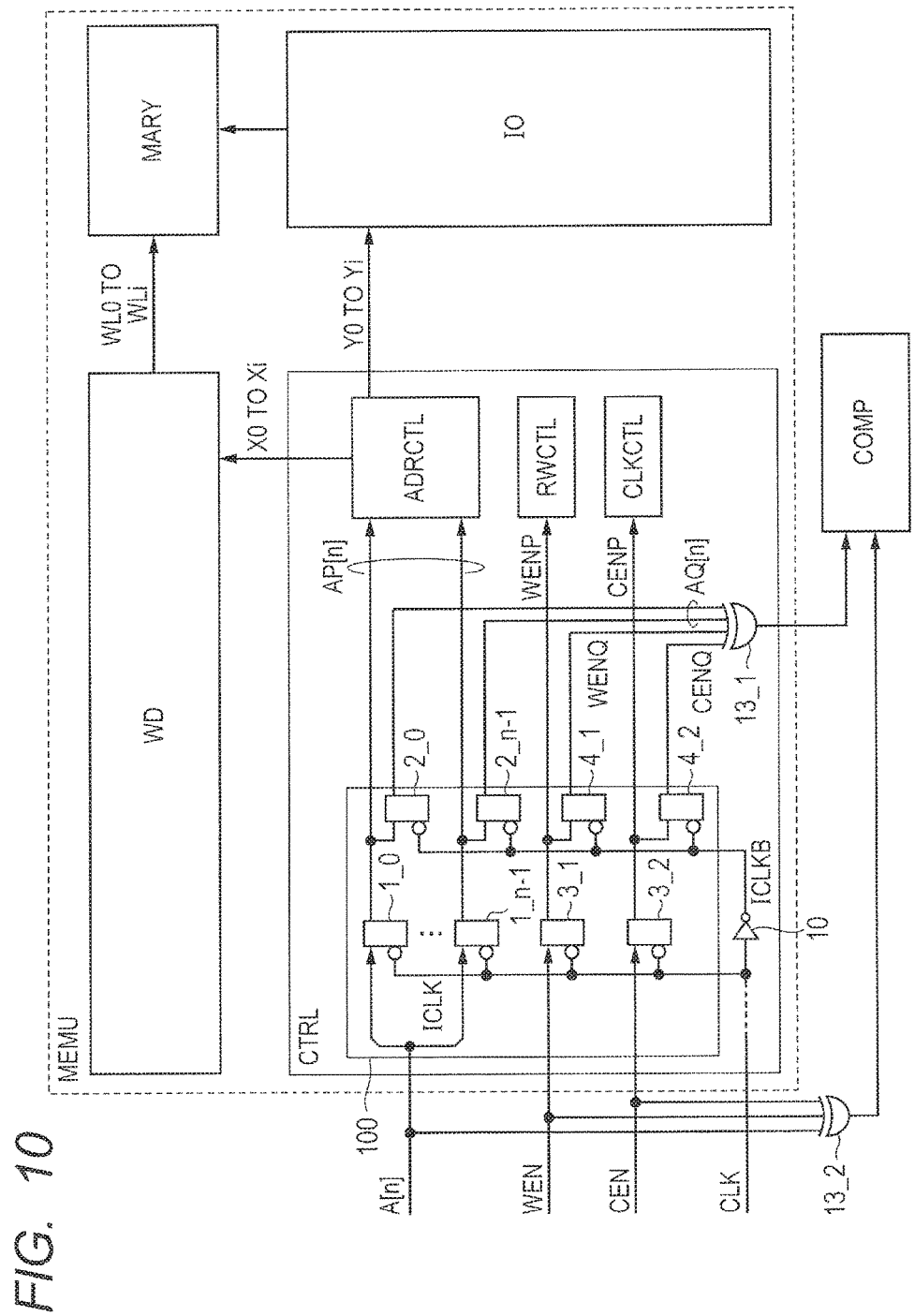
FIG. 10 is a block diagram illustrating one configurational example of a memory macro according to a fifth embodiment of the present invention.

FIG. 10 is a block diagram illustrating one configurational example of the memory macro MEMU according to the fifth embodiment. Although the memory macro MEMU according to the fifth embodiment is same as the memory macro MEMU according to the third embodiment illustrated in FIG. 8, the memory macro MEMU according to the fifth embodiment further includes an EOR gate 13_1 which exclusively ORs the values of internal address signal AQ[n] which is output from the temporary memory circuit 100 and only a one-bit signal which is a result of logical operation of the EOR gate 13_1 is output from the output terminal to the comparator COMP. An EOR gate 13_2 which exclusively ORs the values of the input address signal A[n] is installed at the front stage of the other input terminal of the comparator COMP and the comparator COMP performs comparison between the one-bit signals. Accordingly, it is possible to implement the comparator COMP by a simple logic gate such as an ENOR gate and so forth.

Thereby, the density of wiring lines on the outside of the memory macro MEMU is reduced. Also in this case, it is possible to detect the fault in the circuit which fetches the address signal which is input. That is, it is possible to detect the above-mentioned fault as the fault in the temporary memory circuit 100 by comparing an output result of the exclusive-ORed value of the input address signal with an output result of the exclusive-ORed value of the internal address signal which is output from the internal address output terminal.

In general, when multi-bit signals are exclusively ORed, an amount of information is reduced and the fault detectability is deteriorated. However, even when fault detection has been performed on the basis of the result of execution of the exclusive OR operation, such fault detection has no influence on detection of a single fault which is the highest in frequency and a reduction in fault detection rate is not so serious.

Incidentally, in the example in FIG. 10, also other access control signals WENQ and CENQ are input as exclusive-ORed signals in addition to the internal address signal AQ[n]. Thereby, the density of the wiring lines on the outside of the memory macro MEMU is more reduced. In addition, similarly to the first and second embodiments, an embodiment that the access control signals WENQ and CENQ are made exempt from comparison may be taken.

Further, it is possible to change the number of the front-stage latch circuits to one (for one-bit) by installing the EOR gate 13_1 on the output side of the front-stage latch circuits 1_0 to 1_n−1 and 3_1 to 3_2. Thereby, it is possible to more reduce the circuit scale.

Sixth Embodiment

Figure 11:
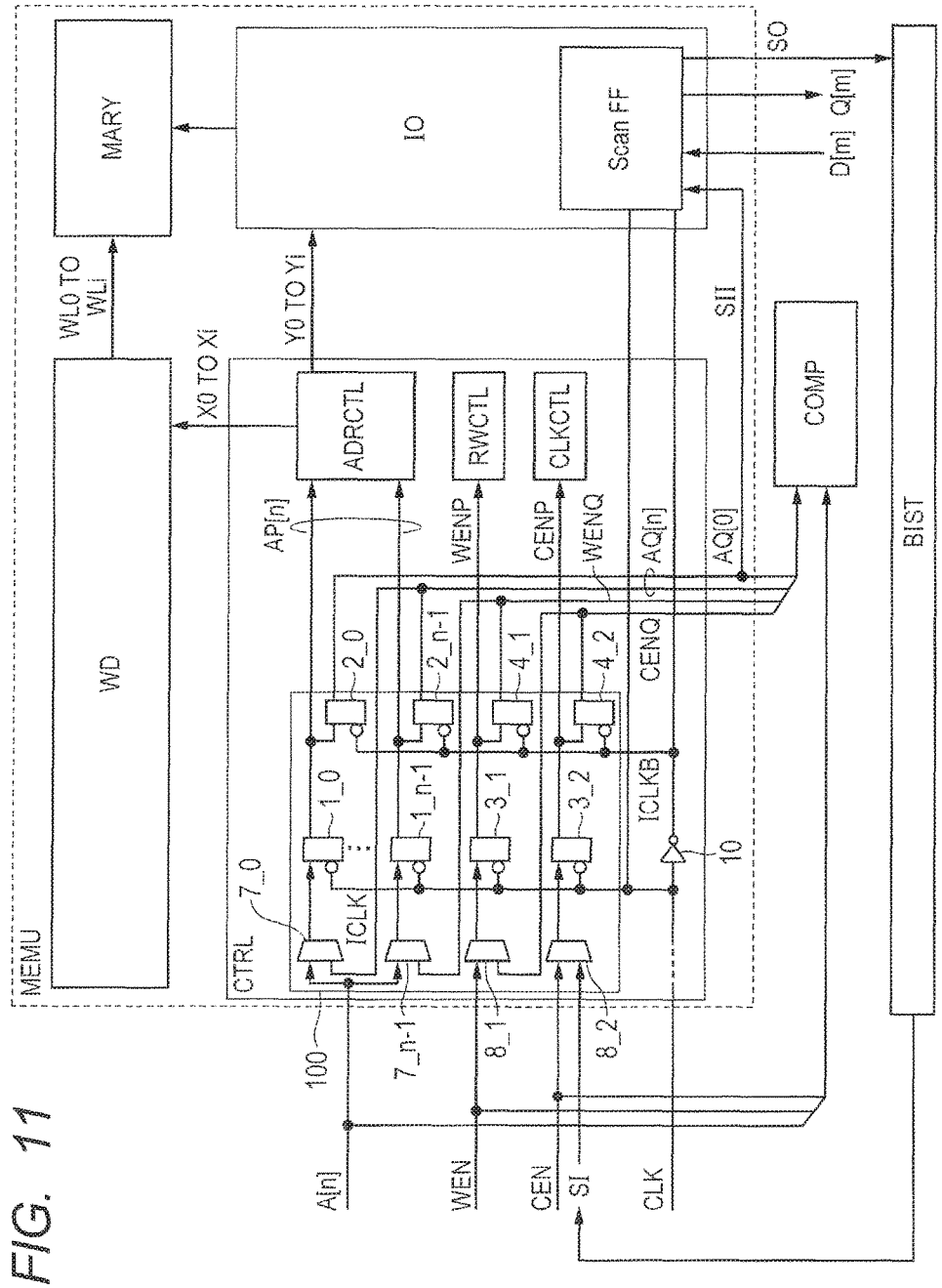
FIG. 11 is a block diagram illustrating one configurational example of a memory macro according to a sixth embodiment of the present invention.

FIG. 11 is a block diagram illustrating one configurational example of the memory macro MEMU according to the sixth embodiment. Although the memory macro MEMU according to the sixth embodiment is the same as the memory macro MEMU according to the third embodiment illustrated in FIG. 8, the temporary memory circuit 100 is configured so as to function as a scan flip-flop chain in a test mode and thereby circuit sharing is promoted. The memory macro MEMU further includes a scan-in terminal SI, a scan-out terminal SO, and a data-side scan flip-flop chain ScanFF which inputs test data into the data-input-output unit 10 in the test mode. In addition, selectors 7_0 to 7_n−1 and 8_1 to 8_2 are added to the temporary memory circuit 100 and thereby the temporary memory circuit 100 functions as an address-side scan flip-flop chain which scans a test address into the control unit CTRL in the test mode.

In a scan mode, the test data which is sequentially and serially input from the test circuit BIST which is installed outside the memory macro MEMU into the scan-in terminal SI passes through the selector 8_2, the latch circuit 3_2 and the latch circuit 4_2 and is transferred to the next selector 8_1 and then passes through the latch circuit 3_1 and the latch circuit 4_1 and is sequentially transferred to the next selector 7_1. The adjacent flip-flops are sequentially cascade-coupled by the selectors and function as the scan flip-flop chain in this way, and the address signal AQ[0] is transferred to an input signal line SII of the data-side scan flip-flop chain ScanFF. Then, the address signal AQ[0] is output from the scan-out terminal SO passing through the data-side scan flip-flop chain ScanFF. In the test mode, after shifted by using a predetermined number of clocks, a test step is executed on the signal and a result of execution of the test step is captured and thereafter the result is scanned out and output. In the test step, the output signals AP[n], WENP and CENP are respectively supplied from the latch circuits 1_0 to 1_n−1 and 3_1 to 3_2 which are installed on the front-stage side of the temporary memory circuit 100 to the address decoder ADRCTL, the read/write control circuit RWCTL and the clock control circuit CLKCTL.

Thereby, the temporary memory circuit which retains the internal address signals in the normal operation mode also functions as the scan flip-flop chain in the test mode and thereby the circuit scale is reduced.

Seventh Embodiment

Figure 12:
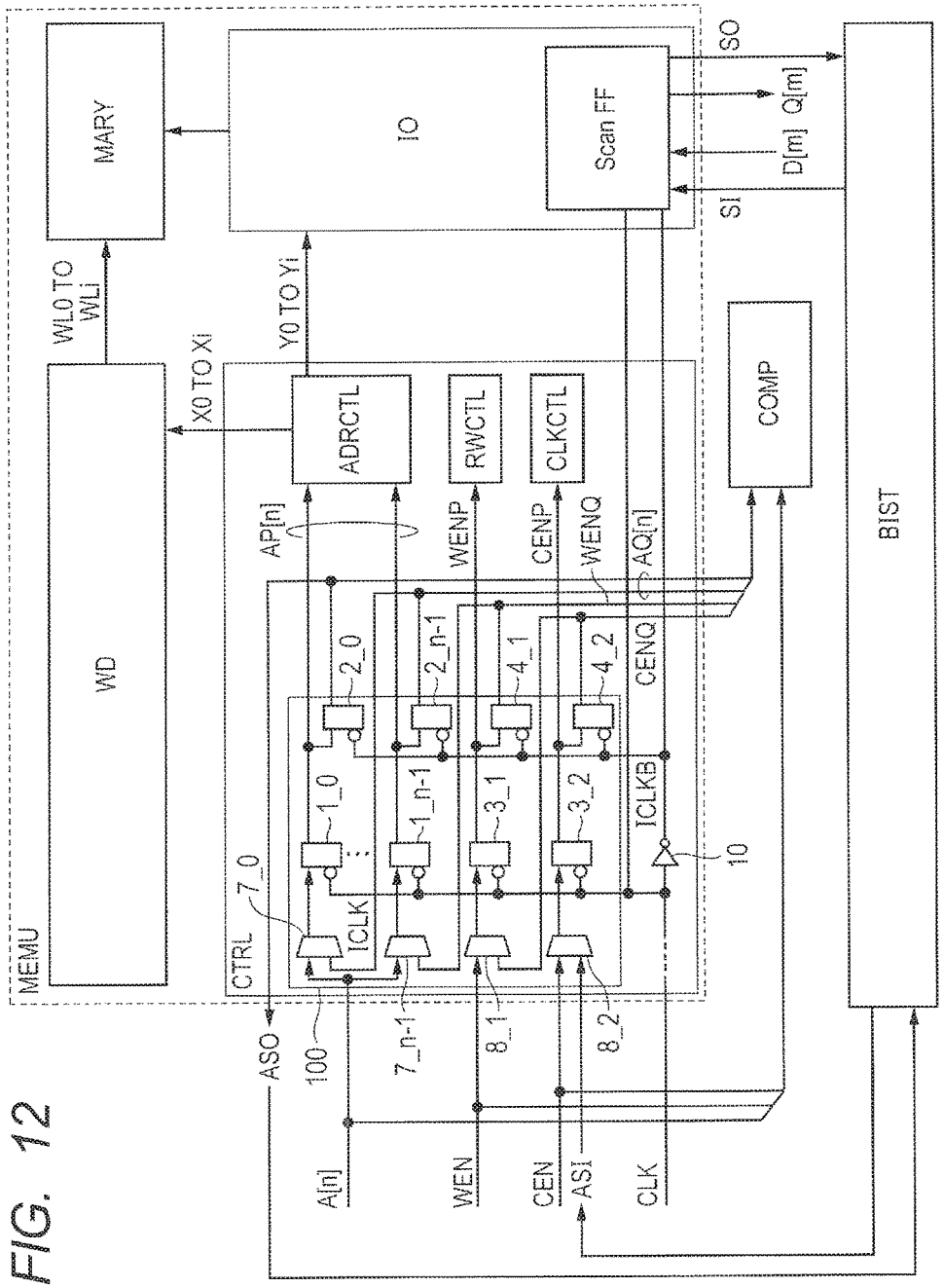
FIG. 12 is a block diagram illustrating one configurational example of a memory macro according to a seventh embodiment of the present invention.

FIG. 12 is a block diagram illustrating one configurational example of the memory macro MEMU according to the seventh embodiment. Although the memory macro MEMU according to the seventh embodiment is the same as the memory macro MEMU according to the sixth embodiment illustrated in FIG. 11, the memory macro MEMU according to the seventh embodiment is different from the memory macro MEMU according to the sixth embodiment in the point that the address-side scan flip-flop chain is separated from the data-side scan flip-flop chain. The memory macro MEMU according to the seventh embodiment includes an address-side scan-in terminal ASI, an address-side scan-out terminal ASO, the data-side scan-in terminal SI, the data-side scan-out terminal SO and so forth. The signal AQ[0] which is input into the data-side scan flip-flop chain in FIG. 11 is output from the address-side scan-out terminal ASO. The test data is scanned in parallel into both of the address-side scan-in terminal ASI and the data-side scan-in terminal ASI from the test circuit BIST which is installed outside the memory macro MEMU and the test data is scanned in parallel out of both of the address-side scan-out terminal ASO and the data-side scan-out terminal SO.

Thereby, the temporary memory circuit which retains the internal address signals in the normal operation mode also functions as the scan flip-flop chain in the test mode and therefore the circuit scale is reduced. In addition, the time taken for execution of the memory test is reduced by more reducing the length of the scan flip-flop chain than the scan flip-flop chain in the sixth embodiment.

Eighth Embodiment

Figure 13:
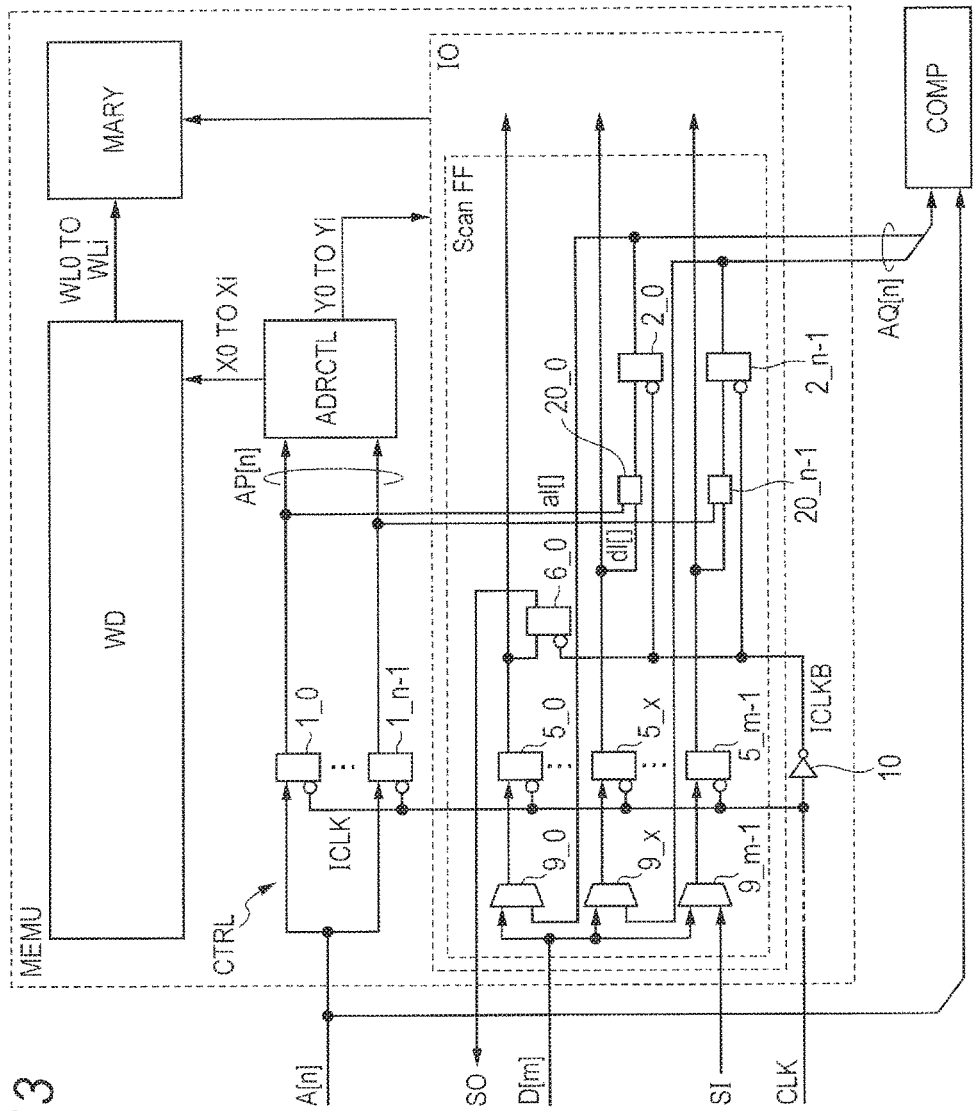
FIG. 13 is a block diagram illustrating one configurational example of a memory macro according to an eighth embodiment of the present invention.

FIG. 13 is a block diagram illustrating one configurational example of the memory macro MEMU according to the eighth embodiment. In the memory macro MEMU according to the eighth embodiment, part of the temporary memory circuit 100 illustrated in FIG. 6 is shared with part of the data-side scan flip-flop chain ScanFF in circuit. Other configurations are the same as those in FIG. 6 and therefore detailed description thereof is omitted.

While the configuration of the data-side scan flip-flop chain ScanFF will be described in detail in order to specifically describe circuit sharing, illustration of a boundary line of the temporary memory circuit 100 is omitted.

The data-side scan flip-flop chain ScanFF includes m selectors 9_0 to 9_$m$–1, m front-stage latch circuits 5_0 to 5_$m$–1, m rear-stage latch circuits 6_0 to 6_$x$ and the rear-stage latch circuits 2_0 to 2_$n$–1 in correspondence with m-bit data D[m]. The rear-stage latch circuits 2_0 to 2_$n$–1 also serve as the rear-stage latch 2_0 to 2_$n$–1 of the temporary memory circuit 100. Logic circuits 20_0 to 20_$n$–1 are respectively added to the rear-stage latch circuits 2_0 to 2_$n$–1 for sharing. On the other hand, outputs from the front-stage latch circuits 5_0 to 5_$x$–1 are directly input into the rear-stage latch circuits 6_0 to 6_$x$ which are not shared with other circuits.

Figures 14, 15:
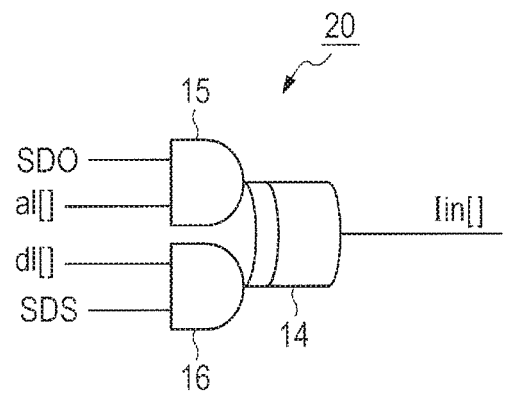
FIG. 14 is a circuit diagram illustrating one configurational example of a logic circuit in FIG. 13.
FIG. 15 is an explanatory diagram illustrating one example of functions of the logic circuit in FIG. 13 indicated in a truth table.

FIG. 14 is a circuit diagram illustrating one configurational example of each of the logic circuits 20_0 to 20_$n$–1 and FIG. 15 is an explanatory diagram illustrating one example of the functions of the logic circuit indicated in a truth table.

As illustrated in FIG. 14, a logic circuit 20 which is the configurational example of the logic circuits 20_0 to 20_$n$–1 includes two AND gates 15 and 16 and one EOR gate 14.

In the normal operation mode, the internal address signal AP[n] is transferred to each of the rear-stage latch circuit 2_0 to 2_$n$–1 by inputting a control signal SDS=0 and a control signal SDO=1. The front-stage circuits 1_0 to 1_$n$–1 and the rear-stage latch circuits 2_0 to 2_$n$–1 are combined together and operate as the flip-flop and an output signal from the flip-flop is output to the comparator COMP as the signal AQ[n]. The operation in this mode is the same as that in the second embodiment.

In a scan data shifting mode, output signals from the front-stage latch circuits 5_$x$ to 5_$m$–1 which configure the data-side scan flip-flop chain ScanFF are supplied to the rear-stage latch circuits 2_0 to 2_$n$–1 by inputting the control signal SDS=1 and the control signal SDO=0. Here, it is assumed that x=m–n. The remaining front-stage latch circuits 5_0 to 5_$x$–1 are coupled to the rear-stage latch circuits 6_0 to 6_$x$ (only the latch circuit 6_0 is representatively illustrated and illustration of other latch circuits is omitted) which are not shared with other circuits. In a scan data fetching mode, an exclusive-ORed signal di[ ] ˆai [ ] of di [ ] scan data and the internal address signal AP[n] which is input into a terminal ai [ ] is input into the rear-stage latch circuits 0_0 to 2_$n$–1 by inputting the control signal SDS=1 and the control signal SDO=1.

Thereby, the temporary memory circuit 100 which retains the internal address signal in the normal operation mode also functions as the data-side scan flip-flop chain in the test mode and the circuit scale is reduced.

Although the invention which has been made by the inventor and others has been specifically described on the basis of the embodiments thereof as mentioned above, it goes without saying that the present invention is not limited to the above-mentioned embodiments and may be altered and modified in a variety of ways within a range not deviating from the gist of the present invention.

For example, block division illustrated in each block diagram is merely one example and it is possible to appropriately and optionally make an alteration which is realized by altering one block to another block that some or all functions in one block have been realized so as to be harmoniously integrated with functions of another block. In addition, the positive logic and the negative logic which have been adopted in the circuits illustrated in the drawings are merely examples and may be optionally altered.

What is claimed is:
1. A memory macro comprising:
an address input terminal;
a clock input terminal;
a data input-output terminal;
a memory array which includes a plurality of memory cells which are selected by a word line;
a word line drive circuit;
a data input-output circuit which outputs data in the memory array to the data input-output terminal; and
a control circuit,
wherein the control circuit includes a temporary memory circuit which fetches an input address signal which is input into the address input terminal in synchronization with an input clock signal which is input from the clock input terminal and outputs the input address signal so fetched as an internal address signal and an address decoder which outputs an address decode signal on the basis of the internal address signal,
wherein the word line drive circuit selects and drives the word line which corresponds to the memory cell concerned of the memory array on the basis of the address decode signal,
wherein the data input-output circuit outputs the data in the memory cell concerned of the memory array which has been selected by the word line to the data input-output terminal, and wherein the memory macro further includes an internal address output terminal which outputs the internal address signal.

2. The memory macro according to claim 1,
wherein the temporary memory circuit includes a latch circuit which fetches the input address signal when the input clock signal is at a first logic level and retains a value which has been fetched when the input clock signal is at a second logic level which is different from the first logic level as the internal address signal regardless of the value of the input address signal, and
wherein the internal address signal is input into the address decoder.

3. The memory macro according to claim 1,
wherein the temporary memory circuit includes
a first latch circuit which fetches the input address signal when the input clock signal is at a first logic level and retains a value which has been fetched when the input clock signal is at a second logic level which is different from the first logic level as a first internal address signal regardless of the value of the input address signal, and
a second latch circuit which fetches the first internal address signal when the input clock signal is at the second logic level and retains a value which has been fetched when the input clock signal is at the first logic level as the internal address signal, and
wherein the first internal address signal is input into the address decoder.

4. The memory macro according to claim 3, further comprising:
a control signal terminal into which an access control signal is input; and
an access control circuit,
wherein the temporary memory circuit includes
a third latch circuit which fetches the access control signal when the input clock signal is at the first logic level and retains a value which has been fetched when the input clock signal is at the second logic level as a first access control signal regardless of the value of the access control circuit, and
a fourth latch circuit which fetches the first access control signal when the input clock signal is at the second logic level and retains a value which has been fetched when the input clock signal is at the first logic level as an internal access control signal, and
wherein the control circuit controls access to the memory array on the basis of the first access control signal, and
wherein the memory macro further includes an internal access control signal output terminal which outputs the internal access control signal.

5. The memory micro according to claim 4,
wherein the access control signal includes an enable signal,
wherein the access to the memory array is permitted when the enable signal has been asserted,
wherein the third latch circuit includes a latch circuit which fetches the enable signal when the input clock signal is at the first logic level and retains a value which has been fetched when the input clock signal is at the second logic level as a first enable signal regardless of the value of the enable signal, and
wherein the control circuit stops outputting of the internal address signal to the internal address output terminal when the first enable signal has been negated.

6. The memory macro according to claim 1,
wherein the control circuit further includes an exclusive OR circuit which uses the internal address signal as an input, and
wherein a result of output from the exclusive OR circuit is output from the address output terminal in place of the internal address signal.

7. The memory macro according to claim 3, further comprising:
a scan-in terminal;
a scan-out terminal; and
a data-side scan flip-flop chain which inputs test data into the data input-output circuit in a test mode,
wherein a flip-flop which is configured by the first latch circuit and the second latch circuit configures an address-side scan flip-flop chain which inputs a test address into the control circuit in the test mode, and
wherein the data-side scan flip-flop chain and the address-side scan flip-flop chain are coupled together, and in the test mode, sequentially shift a test signal which is input from the scan-in terminal, supply the test data and the test address and output a test result from the scan-out terminal.

8. The memory macro according to claim 3, further comprising:
an address-side scan-in terminal;
an address-side scan-out terminal;
a data-side scan-in terminal;
a data-side scan-out terminal; and
a data-side scan flip-flop chain which inputs test data into the data input-output circuit in a test mode,
wherein a flip-flop which is configured by the first latch circuit and the second latch circuit configures an address-side scan flip-flop chain which inputs a test address into the control circuit in the test mode, and
wherein, in the test mode, a test signal which is input from the address-side scan-in terminal is sequentially shifted and is supplied as the test address, and a test signal which is input from the data-side scan-in terminal is sequentially shifted and is supplied as the test data.

9. The memory macro according to claim 3, further comprising:
a scan-in terminal;
a scan-out terminal; and
a data-side scan flip-flop chain which inputs test data into the data input-output circuit in a test mode,
wherein the second latch circuit is included in the data-side scan flip-flop chain,
wherein, in the test mode, a test signal which is input from the scan-in terminal is sequentially shifted and is supplied as the test data, and
wherein, in a normal operation mode which is different from the rest mode, the second latch circuit fetches the first internal address signal and outputs the first internal address signal so fetched from the internal address output terminal as the internal address signal.

10. A semiconductor integrated circuit device comprising:
a memory into which an input address signal and an input clock signal are input and which stores data and outputs the data so stored; and
a comparator,
wherein the memory includes a memory array which includes a plurality of memory cells which are selected by a word line, a word line drive circuit, a data input-output circuit which outputs data in the memory array, and a control circuit, wherein the control circuit includes a temporary memory circuit which fetches the input address signal in synchronization with the input clock signal and outputs the input address signal so fetched as an internal address signal, and an address decoder which outputs an address decode signal on the basis of the internal address signal, wherein the word line drive circuit selects and drives the word line which corresponds to the memory cell concerned of the memory array on the basis of the address decode signal, wherein the data input-output circuit outputs data in the memory cell concerned of the memory array which has been selected by the word line to the data input-output terminal, and wherein the comparator compares the input address signal with the internal address signal to see whether the input address signal matches the internal address signal.

11. The semiconductor integrated circuit device according to claim 10, wherein the temporary memory circuit includes a latch circuit which fetches the input address signal when the input clock signal is at a first logic level and retains a value which has been fetched when the input clock signal is at a second logic level which is different from the first logic level as the internal address signal regardless of the value of the input address signal, and wherein the internal address signal is input into the address decoder.

12. The semiconductor integrated circuit device according to claim 10, wherein the temporary memory circuit includes a first latch circuit which fetches the input address signal when the input clock signal is at a first logic level and retains a value which has been fetched when the input clock signal is at a second logic level which is different from the first logic level as a first internal address signal regardless of the value of the input address signal, and a second latch circuit which fetches the first internal address signal when the input clock signal is at the second logic level and retains a value which has been fetched when the input clock signal is at the first logic level as the internal address signal, and wherein the first internal address signal is input into the address decoder.

13. The semiconductor integrated circuit device according to claim 12, wherein the memory includes a control signal terminal into which an access control signal is input and an access control circuit, wherein the temporary memory circuit includes a third latch circuit which fetches the access control signal when the input clock signal is at the first logic level and retains a value which has been fetched when the input clock signal is at the second logic level as a first access control signal regardless of the value of the access control signal, and a fourth latch circuit which fetches the first access control signal when the input clock signal is at the second logic level and retains a value which has been fetched when the input clock signal is at the first logic level as the internal access control signal, wherein the control circuit controls access to the memory array on the basis of the first access control signal, and wherein the comparator further compares the access control signal with the internal access control signal to see whether the access control signal matches the internal access control signal, in addition to seeing whether the input address signal matches the internal address signal.

14. The semiconductor integrated circuit device according to claim 13, wherein the access control signal includes an enable signal, wherein the access to the memory array is permitted when the enable signal has been asserted, wherein the third latch circuit includes a latch circuit which fetches the enable signal when the input clock signal is at the first logic level and retains a value which has been fetched when the input lock signal is at the second logic level as a first enable signal regardless of the value of the enable signal, and wherein the control circuit stops outputting of the internal address signal to the internal address output terminal when the first enable signal has been negated.

15. The semiconductor integrated circuit device according to claim 10, further comprising:

a first exclusive OR circuit which exclusively ORs all bits of the input address signal; and a second exclusive OR circuit which exclusively ORs all bits of the internal address signal, wherein the comparator further compares an output from the first exclusive OR circuit with an output from the second exclusive OR circuit to see whether the output from the first exclusive OR circuit matches the output from the second exclusive OR circuit, in place of seeing whether the input address signal matches the internal address signal.

16. The semiconductor integrated circuit device according to claim 12, wherein the memory further includes a scan-in terminal, a scan-out terminal and a data-side scan flip-flop chain which inputs test data into the data input-output circuit in a test mode, wherein a flip-flop which is configured by the first latch circuit and the second latch circuit configures an address-side scan flip-flop chain which inputs a test address into the control circuit in the test mode, and wherein the data-side scan flip-flop chain and the address-side scan flip-flop chain are coupled with each other, and, in the test mode, sequentially shift a test signal which is input from the scan-in terminal, supply the test data and the test address and output a test result from the scan-out terminal.

17. The semiconductor integrated circuit device according to claim 12, wherein the memory further includes a data-side scan-in terminal, a data-side scan-out terminal and a data-side scan flip-flop which inputs test data into the data input-output circuit in a test mode, wherein a flip-flop which is configured by the first latch circuit and the second latch circuit includes an address-side scan-in terminal and an address-side scan-out terminal and configures an address-side scan flip-flop chain which inputs test address into the control circuit in the test mode, and wherein, in the test mode, a test signal which is input from the address-side scan-in terminal is sequentially shifted and is supplied as the test address and a test signal which is input from the data-side scan-in terminal is sequentially shifted and is supplied as the test data.

18. The semiconductor integrated circuit device according to claim 12,
- wherein the memory further includes a scan-in terminal, a scan-out terminal and a data-side scan flip-flop which inputs test data into the data input-output circuit in a test mode,
- wherein the second latch circuit is included in the data-side scan flip-flop chain,
- wherein, in the test mode, a test signal which is input from the scan-in terminal is sequentially shifted and supplied as the test data, and
- wherein, in a normal operation mode which is different from the test mode, the second latch circuit fetches the first internal address signal and outputs the first internal address signal so fetched to the comparator as the internal address signal.

\* \* \* \* \*